US012681107B2

(12) United States Patent
Yang

(10) Patent No.: US 12,681,107 B2
(45) Date of Patent: Jul. 14, 2026

(54) DETECTION CIRCUIT FOR POWER LOAD AND METHOD FOR DETECTION THEREOF

(71) Applicant: INFSITRONIX TECHNOLOGY CORPORATION, Hsinchu County (TW)

(72) Inventor: Hui-Tsung Yang, Hsinchu County (TW)

(73) Assignee: INFSITRONIX TECHNOLOGY CORPORATION, Hsinchu County (TW)

( * ) Notice: Subject to any disclaimer, the term of this patent is extended or adjusted under 35 U.S.C. 154(b) by 148 days.

(21) Appl. No.: 18/774,954

(22) Filed: Jul. 17, 2024

(65) Prior Publication Data

US 2025/0028007 A1     Jan. 23, 2025

Related U.S. Application Data

(60) Provisional application No. 63/527,091, filed on Jul. 17, 2023.

(51) Int. Cl.
   G01R 31/40     (2020.01)
   G01R 35/00     (2006.01)

(52) U.S. Cl.
   CPC ........... G01R 31/40 (2013.01); G01R 35/005 (2013.01)

(58) Field of Classification Search
   CPC .............................. G01R 31/40; G01R 35/005
   See application file for complete search history.

(56) References Cited

U.S. PATENT DOCUMENTS

| | | | | |
|---|---|---|---|---|
| 4,795,969 A | * | 1/1989 | So | G01R 35/005 |
| | | | | 323/356 |
| 10,044,274 B2 | * | 8/2018 | Yang | H02H 3/207 |
| 2014/0268950 A1 | | 9/2014 | Medina-Garcia | |
| 2024/0250611 A1 | * | 7/2024 | Mirvakili | H03F 3/72 |

FOREIGN PATENT DOCUMENTS

| | | | |
|---|---|---|---|
| TW | 201340563 A | 10/2013 | |
| TW | 201346485 A | 11/2013 | |

OTHER PUBLICATIONS

Machine translation of TW113126647 Office Action Search report on Mar. 24, 2025 (Year: 2025).*
Taiwan Intellectual Property Office Office Action Search report on Mar. 24, 2025, TW113126647.

* cited by examiner

*Primary Examiner* — Reena Aurora
(74) *Attorney, Agent, or Firm* — WPAT, PC

(57) ABSTRACT

The present application relates to a detection circuit for power load and a method for detection thereof. The detection circuit comprises a sensing circuit and a signal generation circuit. The signal generation circuit includes a calibration circuit. The sensing circuit senses an output power signal of a power supply unit for obtaining a sensing impedance. Thereby, a corresponding power sensing signal is generated according to the sensing impedance and the output power signal. The signal generation circuit generates a power ratio signal. The calibration circuit generates a calibrating signal according to the power ratio signal for driving the signal generation circuit to perform feedback control for generating the power ratio signal. The power ratio signal will match the load condition and be applied to provide the output power signal with less error.

11 Claims, 6 Drawing Sheets

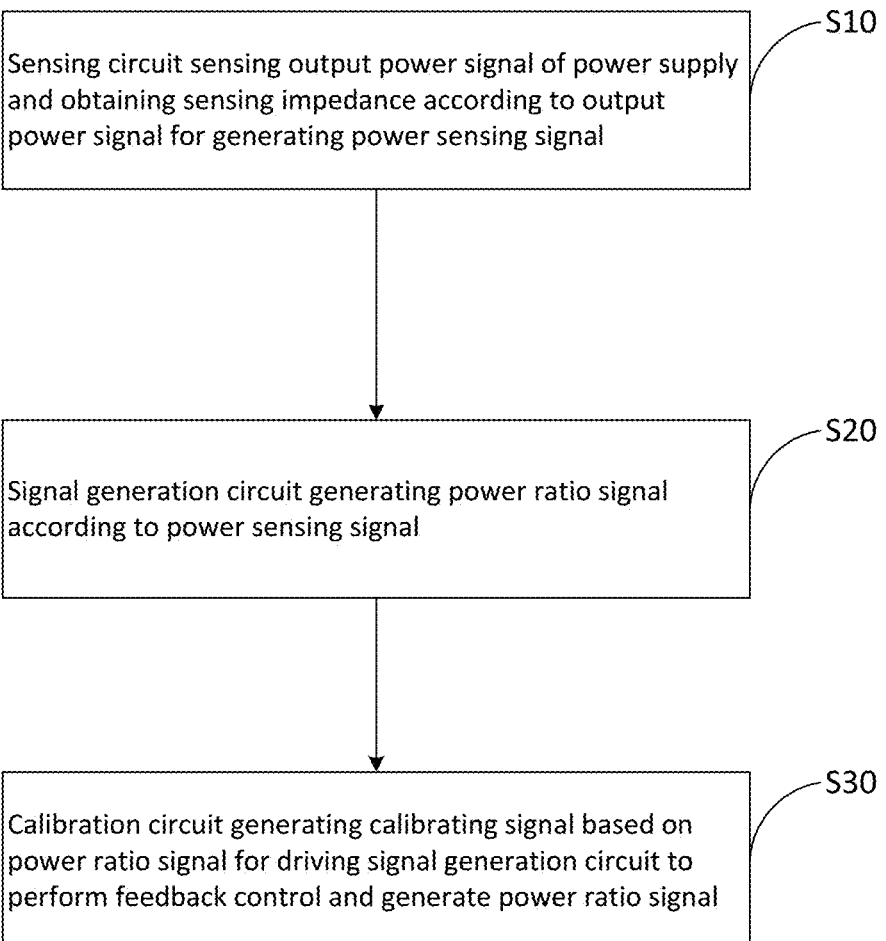

Sensing circuit sensing output power signal of power supply and obtaining sensing impedance according to output power signal for generating power sensing signal — S10

Signal generation circuit generating power ratio signal according to power sensing signal — S20

Calibration circuit generating calibrating signal based on power ratio signal for driving signal generation circuit to perform feedback control and generate power ratio signal — S30

Fig. 3

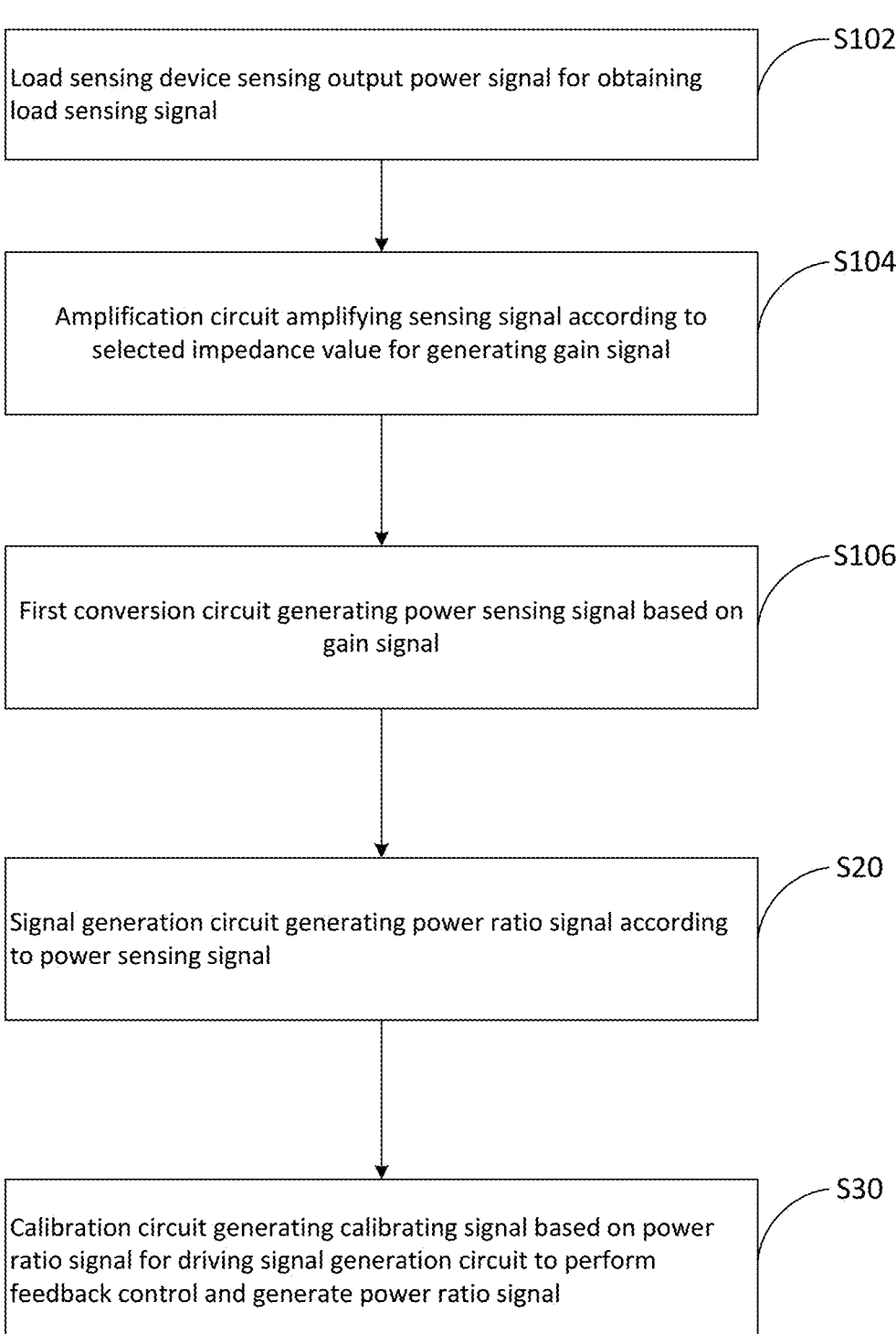

Load sensing device sensing output power signal for obtaining load sensing signal ⟋S102

Amplification circuit amplifying sensing signal according to selected impedance value for generating gain signal ⟋S104

First conversion circuit generating power sensing signal based on gain signal ⟋S106

Signal generation circuit generating power ratio signal according to power sensing signal ⟋S20

Calibration circuit generating calibrating signal based on power ratio signal for driving signal generation circuit to perform feedback control and generate power ratio signal ⟋S30

Fig. 4

DETECTION CIRCUIT FOR POWER LOAD AND METHOD FOR DETECTION THEREOF

FIELD OF THE INVENTION

The present application related to a detection circuit and a method thereof, in particular to a detection circuit for power load and a method for detection thereof.

BACKGROUND OF THE INVENTION

In recent years, with the advancement of technology, consumer electronic devices with various application functions have been gradually developed, such as smartphones, notebook computers, smart networked TVs. These consumer electronic devices with various functions not only meet the different living needs of the general public, but also are merged into people's lives, thus providing them with convenience in life.

These consumer electronic devices with various functions include various corresponding electronic components based on their functions, such as: operational processing units, data storage components, memory components, display components, etc., and each electronic component requires different supply voltage. Therefore, when consumer electronic devices require an external power supply, they cannot directly connect to the AC power supply (mains power) provided by today's power supply system. In addition, generally the electronic components are driven by DC power. In order to provide corresponding power for each electronic component for normal operations, the power supply plays an important intermediate role. These consumer electronic devices with various functions require a power supply to convert the AC power, such as the mains power, into appropriate DC power, for example, output power with rated output voltages, for use of the consumer electronic devices.

The disadvantages of the power supplies according to the prior art are as follows:

If the output power is supplied with a single voltage (for example, 12V) and current detection resistors are used to detect the output power, a power ratio signal corresponding to the rated load of the power supply includes the sum of resistance errors caused by all resistors.

If the output power is supplied with multiple voltages (for example, 12V, 5V, and 3.3V) and current detection resistors are used to detect the output power, in addition to the sum of the resistance errors, the power ratio signal corresponding to the rated load of the power supply also includes the error in the normalization control for output power.

Accordingly, how to automatically detect the output power of a power supply and automatically correct the error while supplying a rated power is a problem to be solved by those skilled in the art.

SUMMARY OF THE INVENTION

An objective of the present application is to provide a detection circuit for power load and the method for detection thereof. A calibration circuit correspondingly generates a calibrating signal according to a power ratio signal generated by a signal generation circuit and feeds back the calibrating signal to the signal generation circuit for generating the power ratio signal. Thereby, the output power of a power supply may be detected automatically and the corresponding power ratio signal of the power supply may be adjusted automatically for the application of output power control of power supplies.

To achieve the above main objective, the present application provides a detection circuit for power load, which comprises a sensing circuit and a signal generation circuit. The sensing circuit includes a plurality of impedance devices. The signal generation circuit includes a calibration circuit. The sensing circuit is coupled to a power supply. Thereby, the sensing circuit senses an output power signal of the power supply and obtains a sensing impedance according to the output power signal and the impedance devices. Thereby, the sensing circuit generates a power sensing signal according to the sensing impedance and the output power signal. The signal generation circuit is coupled to the sensing circuit and generates a power ratio signal according to the power sensing signal. In addition, the signal generation circuit also generates a calibrating signal using the calibration circuit according to the power ratio signal for driving the signal generation circuit to perform a feedback control and generate the power ratio signal. Accordingly, the power ratio signal may be applied to control the output power of the power supply and thus avoiding the sum of all resistance errors caused by the circuits and the error in the normalization control for output power.

The present application further provides a method for detection of a detection circuit for power load. First, a sensing circuit senses an output power signal of a power supply and obtains a sensing impedance according to the output power signal and a plurality of impedance devices for generating a power sensing signal. Next, a signal generation circuit generates a power ratio signal according to the power sensing signal. A calibration circuit generates a calibrating signal according to the power ratio signal for generating the power ratio signal by feeding back the calibrating signal to the signal generation circuit. Accordingly, the power ratio signal may be applied to control the output power of the power supply and thus avoiding the sum of all resistance errors caused by the circuits and the error in the normalization control for output power.

BRIEF DESCRIPTION OF DRAWINGS

FIG. 3 shows a flowchart of the method for detection of the detection circuit for power load according to the second embodiment of the present application;

FIG. 4 shows a flowchart of the method for detection of the detection circuit for power load according to the third embodiment of the present application;

DETAILED DESCRIPTION OF THE INVENTION

In order to make the structure and characteristics as well as the effectiveness of the present application to be further understood and recognized, the detailed description of the present application is provided as follows along with embodiments and accompanying figures.

In the specifications and subsequent claims, certain words are used for representing specific devices. A person having ordinary skill in the art should know that hardware manufacturers might use different nouns to call the same device. In the specifications and subsequent claims, the differences in names are not used for distinguishing devices. Instead, the differences in functions are the guidelines for distinguishing. In the whole specifications and subsequent claims, the word "comprising" is an open language and should be explained as "comprising but not limited to". Besides, the word "couple" includes any direct and indirect electrical connection. Thereby, if the description is that a first device is coupled to a second device, it means that the first device is connected electrically to the second device directly, or the first device is connected electrically to the second device via other device or connecting means indirectly.

For current power supplies, while supplying power with a single voltage, the power ratio signal corresponding to the rated load includes the sum of all resistance errors caused by the circuits. While supplying power with multiple voltages, in addition to the sum of the resistance errors, the power ratio signal corresponding to the rated load of the power supply also includes the error in the power normalization control for output.

The present application provides a detection circuit for power load and the method for detection thereof. A calibration circuit generates a corresponding calibrating signal according to a power ratio signal generated by a signal generation circuit and feeds back the calibrating signal to the signal generation circuit for generating the power ratio signal. Thereby, the output power of a power supply may be detected automatically and the corresponding power ratio signal of the power supply may be adjusted automatically for the application of output power control of power supplies.

In the following description, various embodiments of the present application are described using figures for describing the present application in detail. Nonetheless, the concepts of the present application may be embodied by various forms. Those embodiments are not used to limit the scope and range of the present application.

Figure 1:
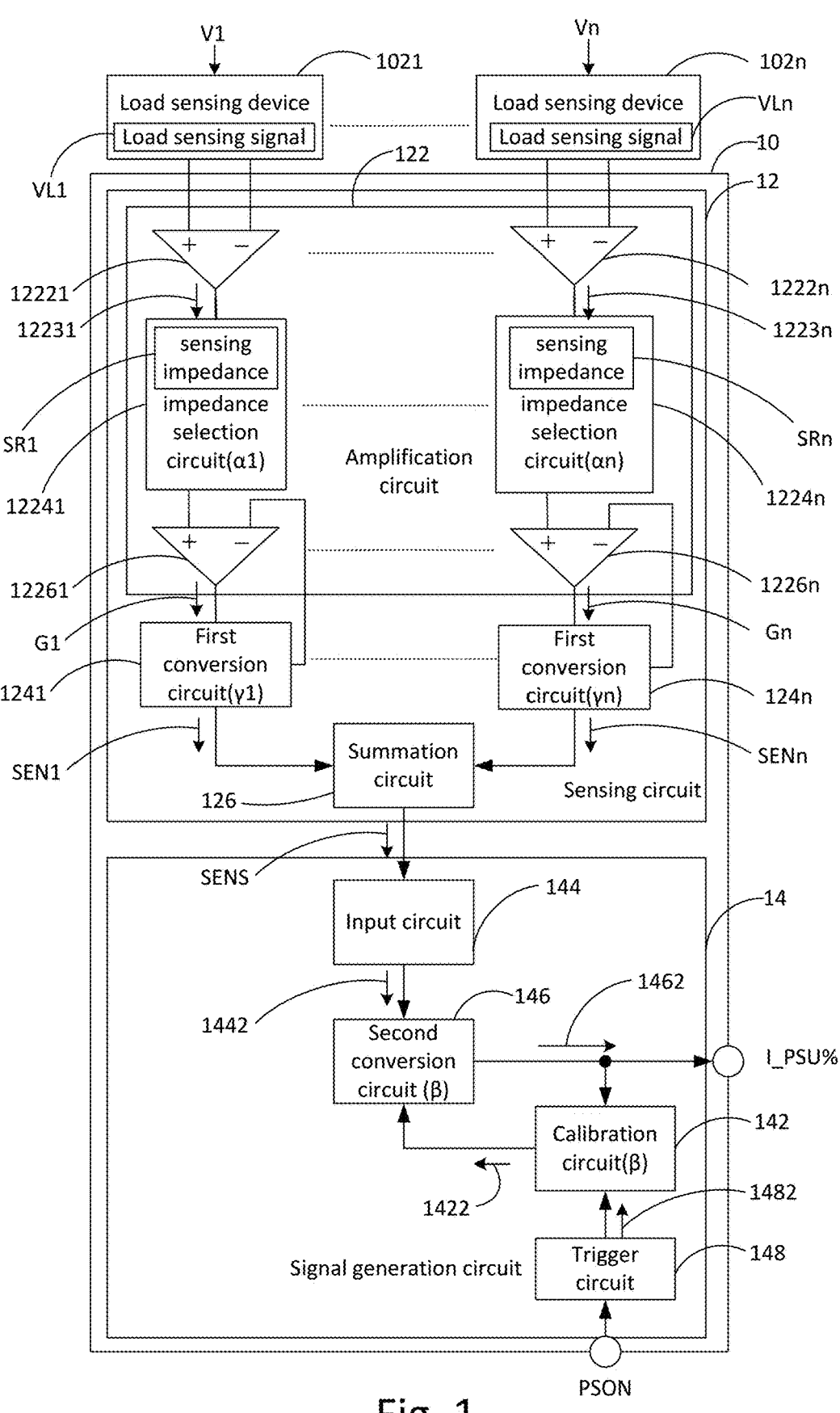
FIG. 1 shows a block diagram of the detection circuit for power load according to the first embodiment of the present application.

Please refer to FIG. 1, which shows a block diagram of the detection circuit for power load according to the first embodiment of the present application. As shown in the figure, the detection circuit for power load 10 according to the first embodiment of the present application comprises a sensing circuit 12 and a signal generation circuit 14. The sensing circuit 12 is coupled to the signal generation circuit 14. The sensing circuit 12 is used to couple to a power supply (not shown in the figure) for detecting one or more output power signal V1~Vn of the power supply and thus generating the corresponding power sensing signals SEN1~SENn, where n is greater than or equal to 1. The signal generation circuit 14 generates a power ratio signal I_PSU % according to the power sensing signals SEN1~SENn. The signal generation circuit 14 includes a calibration circuit 142. The calibration circuit 142 generates a calibrating signal 1422 according to the power ratio signal I_PSU % and feeds it back to the signal generation circuit 14 for generating the power ratio signal I_PSU % for hence controlling the output power of the power supply, namely, controlling the output power of the output power signals V1~Vn, as illustrated in the following.

Please refer to FIG. 1 again. The sensing circuit 12 includes an amplification circuit 122 and a plurality of first conversion circuit 1241~124n. The amplification circuit 122 includes one or more first amplifier 12221~1222n, one or more impedance selection circuit 12241~1224n, and one or more second amplifier 12261~1226n. The first amplifiers 12221~1222 nare coupled to load sensing devices 1021~102n. The impedance selection circuits 12241~1224n are coupled to the first amplifiers 12221~1222n. The second amplifiers 12261~1226n are coupled to the impedance selection circuits 12241~1224n. The first conversion circuits 1241~124n are coupled to the second amplifiers 12261~1226n, where n is greater than or equal to 1.

Figure 2:
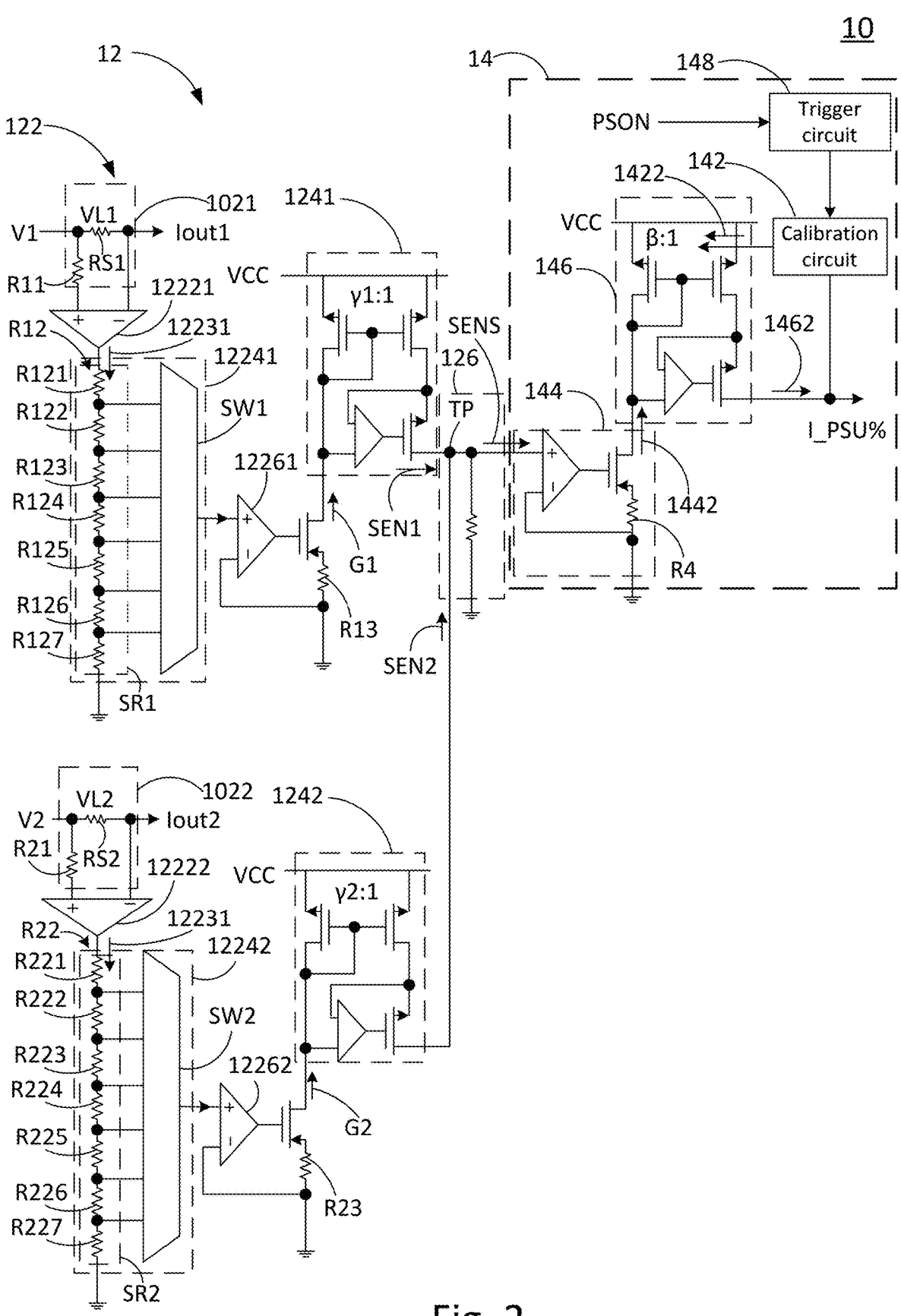
FIG. 2 shows a circuit diagram of the detection circuit for power load according to the second embodiment of the present application.

Next, please refer to FIG. 2, which shows a circuit diagram of the detection circuit for power load according to the second embodiment of the present application. The load sensing devices 1021~102n are coupled to the power supply and hence to the one or more output power signals V1~Vn. Thereby, the load sensing devices 1021~102n may generate the corresponding load sensing signals VL1~VLn, where n is greater than or equal to 1. Thereby, the load sensing signals VL1~VLn are input to the first amplifiers 12221~1222n. After amplification, amplified sensing signals 12231~1223n are generated and input to the impedance selection circuits 12241~1224n. The impedance selection circuits 12241~1224n obtains the corresponding sensing impedances SR1~SRn according to the corresponding amplified sensing signals 12231~1223n of the load sensing signals VL1~VLn and a plurality of impedance devices (for example, a plurality of resistors R121~R127 of a first resistor device R12 shown in FIG. 2). Impedance values of the sensing impedances SR1~SRn correspond to gains α1~an of gain signals G1~Gn. Next, the second amplifiers 12261~1226n generate the gain signals G1~Gn according to the sensing impedances SR1~SRn and the load sensing signals VL1~VLn. The first conversion circuits 1241~124n generate the power sensing signals SEN1~SENn according to the gain signals G1~Gn. The first conversion circuits 1241~124n include first conversion coefficients γ1~γn, respectively. Thereby, the first conversion circuits 1241~124n further convert the gain signal G1~Gn to the power sensing signals SEN1~SENn according to the signal conversion ratios γ1:1~γn:1, where n is greater than or equal to 1.

In other words, according to the present application, the amplification circuit 122 obtains the sensing impedances SR1~SRn according to the load sensing signals VL1~VLn and the impedance devices. The amplification circuit 122 amplifies the load sensing signals VL1~VLn according to the sensing impedances SR1~SRn to generate the gain signals G1~Gn. Then the first conversion circuit 1241~124n generate the power sensing signals SEN1~SENn according to the gain signals G1~Gn. That is to say, the sensing circuit 12 detects the output power signals V1~Vn and obtains the sensing impedances SR1~SRn according to the output power signals V1~Vn and the impedance devices. The sensing circuit 12 generates the power sensing signals SEN1~SENn according to the impedance values of the sensing impedances SR1~SRn and the output power signals V1~Vn.

Moreover, the sensing circuit 12 according to the present application further includes a summation circuit 126, which is coupled to the first conversion circuits 1241~124n for integrating the power sensing signals SEN1~SENn and generating a summed sensing signal SENS. Thereby, when n=1, the summed sensing signal SENS is equal to one of the power sensing signals SEN1~SENn. Namely, the signal generation circuit 14 may receive a single power signal or multiple power sensing signals for generating the corresponding power ratio signal I_PSU %.

Please refer to FIG. 1 and FIG. 2 again. The signal generation circuit 14 further includes an input circuit 144 and a second conversion circuit 146. The input circuit 144 is coupled to the sensing circuit 12, namely, coupled to the first conversion circuits 1241~124n. According to the present embodiment, for example, the input circuit 144 is coupled to the first conversion circuits 1241~124n via the summation circuit 126. Thereby, according to the present embodiment, the input circuit 144 receives the summed sensing signal SENS as an example. Nonetheless, the present application is not limited to the example. The input circuit 144 may be coupled directly to the first conversion circuits 1241~124n. In other words, the input circuit 144 is combined with the summation circuit 126 for integrating and receiving the power sensing signals SEN1~SENn for generating the corresponding input signal 1442. The input circuit 144 according to the present embodiment includes coupling an output of an amplifier to the gate of a transistor, coupling the resistor coupled by the source of the transistor to a negative input of the amplifier, coupling a positive input of the amplifier to the sensing circuit 12, and coupling the drain of the transistor to the second conversion circuit 146.

The second conversion circuit 146 is coupled to the input circuit 144 for receiving the input signal 1442 and generates the corresponding output signal 1462 according to the input signal 1442. The output signal 1462 of the second conversion circuit 146 according to the present embodiment is the power ratio signal I_PSU % according to the present application. Thereby, the power ratio signal I_PSU % is applied to control the output power of the power supply, namely, to control the output power of the output power signals V1~Vn. Besides, according to the present application, the calibration circuit 142 further generates the calibrating signal 1422 according to the power ratio signal I_PSU %. In other words, the calibration circuit 142 generates the corresponding calibrating signal 1422 according to the output signal 1462 and feeding the calibrating signal 1422 back to the second conversion circuit 146 for performing feedback control on the second conversion circuit 146. Thereby, the second conversion circuit 146 is driven to perform the feedback control on the output signal 1462. Consequently, under supplying single-voltage output power signals V1~Vn, the sum of the resistance errors occurred in the corresponding power ratio signal I_PSU % of the rated load may be reduced. In addition, for multi-voltage output power signals V1~Vn, the error in the normalization control for output power may be further reduced.

Moreover, the calibration circuit 142 according to the present application may further provide a trigger signal 1482 using a trigger circuit 148 to the calibration circuit 142 for enabling the calibration circuit 142 to generate the corresponding calibrating signal 1422 according to the output signal 1462 and feed back to the second conversion circuit 146. The trigger circuit 148 is enabled by a start signal PSON to generate the trigger signal 1482 to the calibration circuit 142. The start signal PSON corresponds to the output power signals V1~Vn, the power sensing signals SEN1~SENn, or the power ratio signal I_PSU %.

Please further refer to FIG. 2. As shown in the figure, the circuit diagram in FIG. 2 will be used to illustrate the present embodiment. According to the present embodiment, the first load sensing device 1021 includes, for example, a first sensing resistor RS1 and a first resistor R11. The impedance selection circuit 12241 includes, for example, a first resistor device R12 and a switch circuit SW1. The first resistor device R12 includes the resistors R121~R127. The first sensing resistor RS1 is much smaller than the first resistor R11. For example, the first sensing resistor RS1 is 1 milli-Ohm (mΩ). The first sensing resistor RS1 is used for sensing the first output power signal V1. According to the present embodiment, the first output current signal Iout1 generated by the first output power signal V1 passing through the first sensing resistor RS1 is sensed for obtaining the load sensing signal VL1. The first amplifier 12221 amplifies the corresponding load sensing signal VL1 and generates the amplified sensing signals 12231. Next, the impedance selection circuit 12241 switches the first resistor device R12 via the switch circuit SW1 based on the load sensing signal VL1 to form the corresponding sensing impedance SR1, which is the gain coefficient α1 corresponding to the load sensing signal VL1.

In other words, the first load sensing device 1021 obtains the load sensing signal VL1. The load sensing signal VL1 is then amplified by the first amplifier 12221. The impedance selection circuit 12241 switches the first resistor device R12 via the switch circuit SW1 according to the load sensing signal VL1 to form the corresponding sensing impedance SR1 and thus obtaining the corresponding gain coefficient α1.

Next, the second amplifier 12261 generates the gain signal G1 to the first conversion circuit 1241 correspondingly according to the sensing impedance SR1 and the load sensing signal VL1. The first conversion circuit 1241 generates the power sensing signal SEN1 according to the signal conversion ratio γ1:1 obtained by the first conversion coefficient γ1 of the first conversion circuit 1241. According to the present embodiment, further comprising the summation circuit 126. Thereby, the power sensing signal SEN1 will be transmitted to the summation circuit 126 first to form a node signal TP. Nonetheless, the present application is not limited to the embodiment. Alternatively, the power sensing signal SEN1 may be transmitted to the signal generation circuit 14 directly. According to the present embodiment, the first conversion circuit 1241 is a current mirror for example. Thereby, the gain signal G1 may be a current signal. The power sensing signal SEN1 generated by the first conversion circuit 1241 may also be a current signal.

Please refer to FIG. 2 again. According to the present embodiment, a second set circuit is further adopted to sense a second output power signal V2. The second load sensing device 1022 includes the second sensing resistor RS2 and the second resistor R12. The second load sensing device 1022 senses the second output power signal V2. The second sensing resistor RS2 of the second load sensing device 1022 senses a second output current signal Iout2 of the second output power signal V2 to obtain the load sensing signal VL2. Thereby, the first amplifier 12222 amplifies the corresponding load sensing signal VL2 and generates the amplified sensing signal 12232. The impedance selection circuit 12242 switches and controls the resistors R221~R227 of the second resistor device R22 via the switch circuit SW2 based on the amplified sensing signal 12232 for obtaining the sensing impedance SR2, namely, obtaining the corresponding gain coefficient α2 of the load sensing signal VL2. Next, the second amplifier 12262 generates the corresponding gain signal G2 according to the sensing impedance SR2 and the load sensing signal VL2. Thereby, the first conversion circuit 1242 may generate the corresponding power sensing signal SEN2 according to the gain signal G2 and the signal conversion ratio γ2:1 obtained by the first conversion coefficient γ2 of the first conversion circuit 1242.

After the input circuit 144 of the signal generation circuit 14 receives the power sensing signals SEN1, SEN2 (namely, the summed sensing signal SENS), it will generate the corresponding input signal 1442 to the second conversion circuit 146. Thereby, the second conversion circuit 146 may correspondingly generate the output signal 1462 according to the input signal 1442, namely, correspondingly generate the power ratio signal I_PSU %. The second conversion circuit 146 converts the input signal 1442 to the output signal 1462, which is just the power ratio signal I_PSU %, according to a second conversion coefficient β. The second conversion circuit 1462 according to the present embodiment is a current mirror circuit. Thereby, the input signal 1442 and the power ratio signal I_PSU % according to the present embodiment are current signals. Nonetheless, the present application is not limited to the embodiment. By adding capacitors or other passive devices at terminals of the circuits, the current signals may be converted to voltage signals. The calibration circuit 142 may correspondingly generate the calibrating signal 1422 according to the output signal 1462 of the second conversion circuit 146, and the calibrating signal 1422 is fed to the second conversion circuit 146 for the feedback control to generate the output signal 1462, namely, for the feedback control to generate the power ratio signal I_PSU %.

In addition, according to the present embodiment, further comprising the trigger circuit 148. The trigger circuit 148 generates the corresponding trigger signal 1482 to the calibration circuit 142 according to the start signal PSON for driving the calibration circuit 142 to generate the corresponding calibrating signal 1422 according to the output signal 1462 of the second conversion circuit 146, and the calibrating signal 1422 is fed to the second conversion circuit 146 and for the feedback control of the signal generating circuit 14 to correspondingly generate the power ratio signal I_PSU %. According to the present embodiment, the first output power signal V1 and the second output power signal V2 are single voltage. Therefore, under single voltage of output power signals V1, V2, the sum of all resistance errors occurred in the power ratio signal I_PSU % corresponding to the rated power load may be reduced.

For example, the first sensing resistor RS1 and the second sensing resistor R2 are both 1 mΩ. The corresponding gain coefficients α1, α2 of the first sensing impedance SR1 and the second sensing impedance SR2 are both 60. The signal conversion ratios γ1:1 and γ2:1 are both 1:1. The resistor R4 of the input circuit 144 is 1 kΩ. The sum of the first output current signal Iout1 and the second output current signal Iout2 is 100 amperes (A). The total output power of the power supply is 1000 watts (W). Thereby, the voltage level of the node signal TP is 100A*1 mΩ*60,namely, 6V. The corresponding current of the fully-output power ratio signal I_PSU % is 1 mA. The corresponding current of the power ratio signal I_PSU % is β*TP/R4, namely, 1 mA=β*6V/1 kΩ. It is deduced that β is 0.16667. If the first output current signal Iout1 and the second output current signal Iout2 are 50 A and 30 A, respectively, the voltage level of the node signal TP is 4.8V, and the power ratio signal I_PSU % is 0.16667*4.8V/1 k, which is equal to 0.8mA and equivalent to 80% of the output power.

Please refer to FIG. 3, which shows a flowchart of the method for detection of the detection circuit for power load according to the second embodiment of the present application comprising steps of:

Step S10: Sensing circuit sensing output power signal of power supply and obtaining sensing impedance according to output power signal for generating power sensing signal;

Step S20: Signal generation circuit generating power ratio signal according to power sensing signal; and Step S30: Calibration circuit generating calibrating signal based on power ratio signal for driving signal generation circuit to perform feedback control and generate power ratio signal.

In the step S10, by referring to FIG. 1 and FIG. 2, the sensing circuit 12 senses the output power signals V1~Vn of the power supply and obtains the corresponding sensing impedances SR1~SRn according to the sensing result, and thus generating the corresponding power sensing signals SEN1~SENn according to the sensing result and the corresponding sensing impedances SR1~SRn, where n is greater than or equal to 1.

In the step S20, by referring to FIG. 1 and FIG. 2, the signal generation circuit 14 further generates the power ratio signal I_PSU % according to the power sensing signals SEN1~SENn generated in the step S10. In particular, in the subsequent step S30, the calibration circuit 142 will generate the corresponding calibrating signal 1422 according to the power ratio signal I_PSU % and feed it back to the signal generation circuit 14. Thereby, the signal generation circuit 14 may generate the corresponding power ratio signal I_PSU %. Consequently, for single-voltage output power signals V1~Vn, the sum of the errors of all resistors in the corresponding power ratio signal I_PSU % of the rated load may be reduced. In addition, for multi-voltage output power signals V1~Vn, the error in the control for output power normalization may be further reduced.

Please further refer to FIG. 4, which shows a flowchart of the method for detection of the detection circuit for power load according to the third embodiment of the present application. The step S10 is further expanded to the following steps:

Step S102: Load sensing device sensing output power signal for obtaining load sensing signal;

Step S104: Amplification circuit amplifying sensing signal according to selected impedance value for generating gain signal; and Step S106: First conversion circuit generating power sensing signal based on gain signal.

In the step S102, please further refer to FIG. 1 and FIG. 2. The load sensing devices 1021~102b coupled to the sensing circuit 12 sense the output power signals V1~Vn of the power supply and generate the corresponding load sensing signals VL1~VLn for inputting to the amplification circuit 122, where n is greater than or equal to 1.

In the step S104, please further refer to FIG. 1 and FIG. 2. The amplification circuit 122 obtains the corresponding sensing impedances SR1~SRn, which is equivalent to obtaining the corresponding gain coefficients α1~α, according to the load sensing signals VL1~VLn. Thereby, the amplification circuit 122 generates the corresponding gain signals G1~Gn according to the sensing impedances SR1~SRn and the load sensing signals VL1~VLn.

In the step S106, please further refer to FIG. 1 and FIG. 2. The first conversion circuit 1241~124n generate the corresponding power sensing signals SEN1~SENn according to the gain signals G1~Gn. Thereby, in the subsequently steps S20 and S30, the power sensing signals SEN1~SENn may be used to generate the corresponding power ratio signal I_PSU %.

Figure 5:
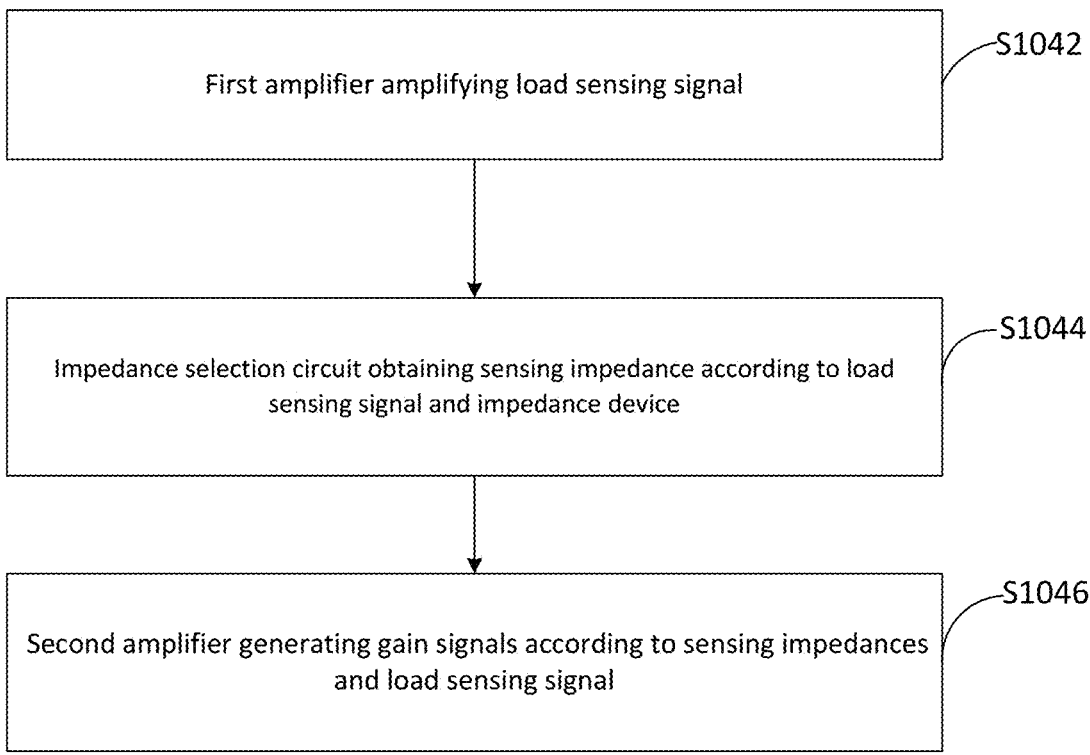
FIG. 5 shows a flowchart of the method for detection of the detection circuit for power load according to the fourth embodiment of the present application.

Pleaser further refer to FIG. 5, which shows a flowchart of the method for detection of the detection circuit for power load according to the fourth embodiment of the present application. The step S104 is further expanded to the following steps:

Step S1042: First amplifier amplifying load sensing signal;

Step S1044: Impedance selection circuit obtaining sensing impedance according to load sensing signal and impedance device; and Step S1046: Second amplifier generating gain signals according to sensing impedances and load sensing signal.

In the step S1042, please further refer to FIG. 1 and FIG. 2. The first amplifiers 12221~1222n are coupled to the load sensing devices 1021~102n for receiving the load sensing signals VL1~VLn and amplifying and transmitting the load sensing signals VL1~VLn to the impedance selection circuits 12241~1224n, where n is greater than or equal to 1.

In the step S1044, please further refer to FIG. 1 and FIG. 2. The impedance selection circuit 12241~1224n obtain the corresponding sensing impedances SR1~SRn from the impedance devices according to the load sensing signals VL1~VLn. In other words, the corresponding gain coefficients α1~an will be obtained, where n is greater than or equal to 1.

In the step S1046, please further refer to FIG. 1 and FIG. 2. The second amplifiers 12261~1226n receive the load sensing signals VL1~VLn amplified in the step S1042 and the sensing impedances SR1~SRn obtained in the step S1044. In other words, the second amplifiers 12261~1226n obtain the corresponding load sensing signals VL1~VLn and the gain coefficients α1~an. Thereby, the second amplifiers 12261~1226n generate the corresponding gain signals G1~Gn for the first conversion circuit 1241~124n, where n is greater than or equal to 1.

Figure 6:
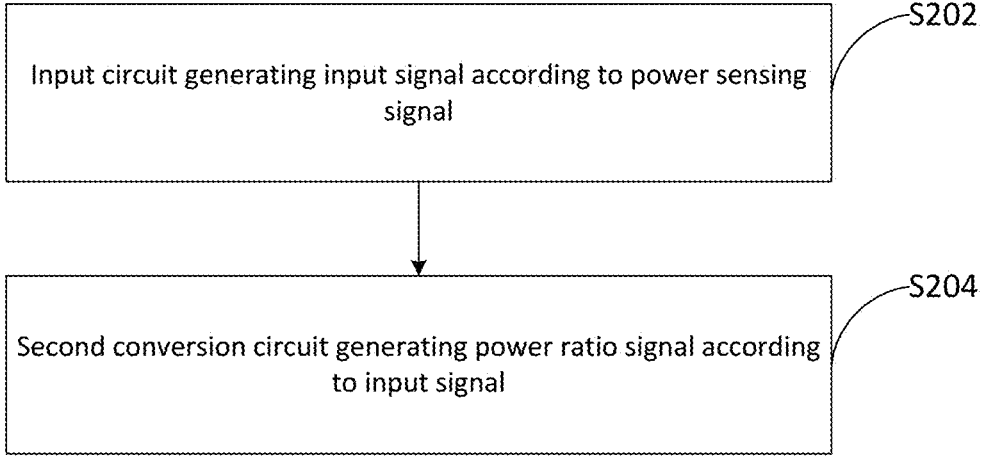
FIG. 6 shows a flowchart of the method for detection of the detection circuit for power load according to the fifth embodiment of the present application.

Please refer to FIG. 6, which shows a flowchart of the method for detection of the detection circuit for power load according to the fifth embodiment of the present application. The step S20 is further expanded to the following steps:

Step S202: Input circuit generating input signal according to power sensing signal; and Step S204: Second conversion circuit generating power ratio signal according to input signal.

In the step S202, please further refer to FIG. 1 and FIG. 2. The power sensing signals SEN1~SENn generated in the step S10 or S106 are transmitted to the input circuit 144. Then the output circuit 144 generates the corresponding input signals 1442 to the second conversion circuit 146 according to the power sensing signals SEN1~SENn.

In the step S204, please further refer to FIG. 1 and FIG. 2. The second conversion circuit 146 receives the input signal 1442 and converts the input signal 1442 to the corresponding output signal 1462, namely, the power ratio signal I_PSU %, according to the corresponding second conversion coefficient β.

Figure 7:
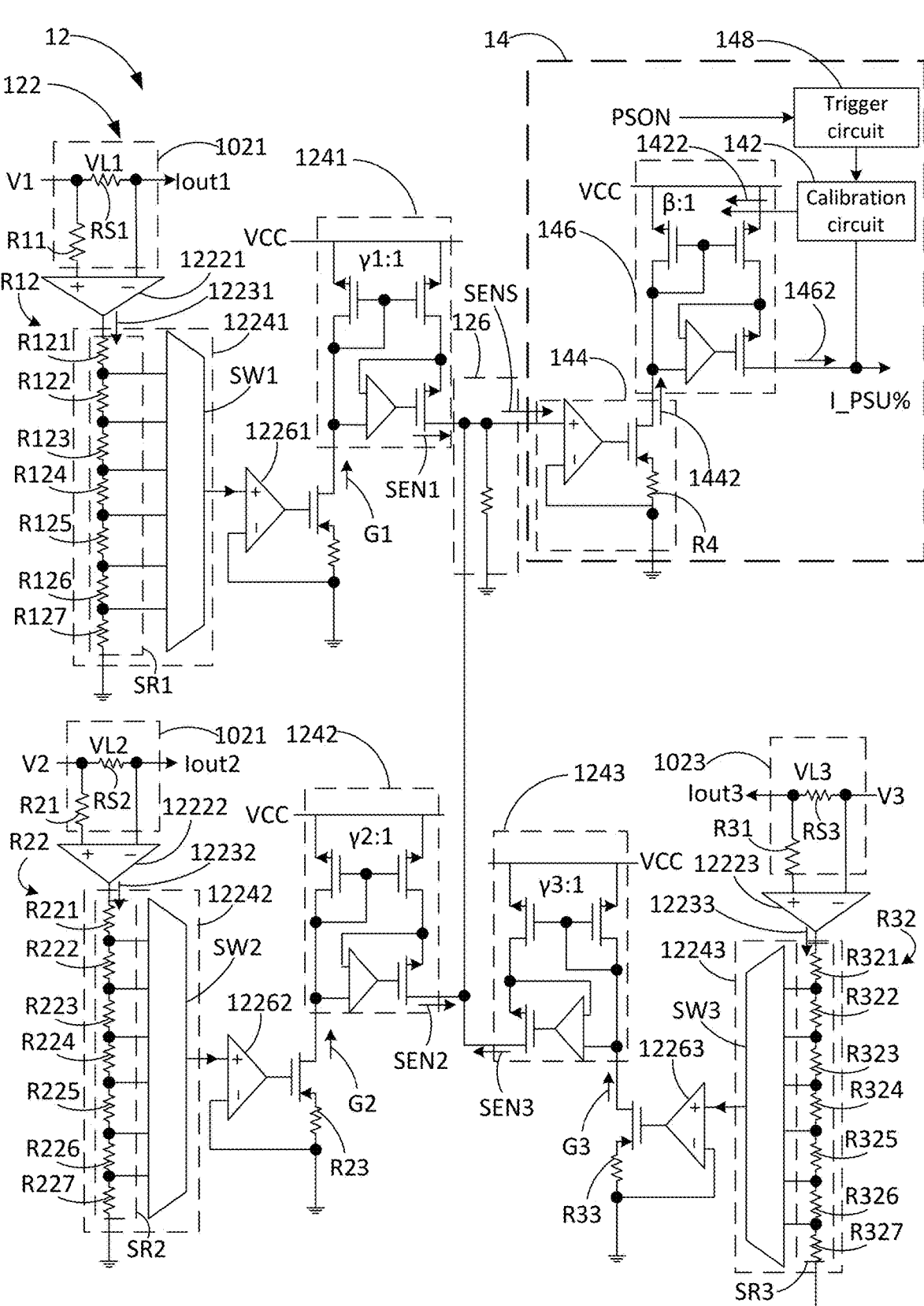
FIG. 7 shows a circuit diagram of the detection circuit for power load according to the sixth embodiment of the present application.

In addition to detecting the first output power signal V1 and the second output power signal V2 with a single voltage according to the above embodiment, as shown in FIG. 7, the first output power signal V1, the second output power signal V2, and the third output power signal V3 with multiple voltages may be detected as well.

Please refer to FIG. 7, which shows a circuit diagram of the detection circuit for power load according to the sixth embodiment of the present application. As shown in the figure, the detection circuit for power load 10 according to the present application may further detect the first output power signal V1, the second output power signal V2, and the third output power signal V3 with multiple voltages. The sensing circuit 12 according to the present embodiment further include a set of circuits for detecting the third output power signal V3. The circuit components for detecting the first output power signal V1 and the second output power signal V2 are identical to FIG. 2. Hence, the details will not be repeated. In addition to adding the circuits for detecting the third output power signal V3, the differences between the present embodiment and FIG. 2 also include the difference in the signal conversion ratios among each set of circuits in the sensing circuit 12, for example, γ1:1, γ2:1, γ3:1 being 1:1, 12/5:1, 12/3.3:1, namely 1:1, 12:5, 12:3.3. According to the present embodiment, the maximum output voltage is 1:1 12V. Nonetheless, the present application is not limited to the embodiment. The maximum voltage level may be used as the baseline for converting to various signal conversion ratios.

Please refer to FIG. 7 again. According to the present embodiment, a third set of circuit is used for detecting the third output power signal V3. A third load sensing device 1023 includes a third sensing resistor RS3 and a third resistor R13. In other words, the third load sensing device 1023 senses the third output power signal V3 and the third sensing resistor RS3 of the third load sensing device 1023 senses a third output current signal Iout3 of the third output power signal V3 and obtaining the load sensing signal VL3. The first amplifier 12223 amplifies the corresponding load sensing signal VL3 and generates the corresponding amplified sensing signal 12233 to the impedance selection circuit 12243. The switch circuit SW3 switches to control the resistors R321~R327 of the second resistor device R32 via the impedance selection circuit 12243 for obtaining the sensing impedance SR3, which correspond to the gain coefficient α3 of the corresponding load sensing signal VL3. Next, the second amplifier 12263 generates the corresponding gain signal G3 according to the sensing impedance SR3 and the load sensing signal VL3, so that the first conversion circuit 1243 may generate the corresponding power sensing signal SEN3 according to the gain signal G3 and the signal conversion ratio γ3:1 obtainn by the first conversion coefficient γ3. In other words, the signal generation circuit 14 generates the corresponding power ratio signal I_PSU % according to the sum of the power sensing signals SEN1, SEN2, SEN3. The present embodiment may be further applied to multi-voltage output power signals.

For example, the first sensing resistor RS1 and the second sensing resistor RS2 are both 1 mΩ. The corresponding gain coefficients α1, α2, α3 of the sensing impedances SR1~SR3 are 40, 50, 50, respectively. The signal conversion ratios γ1:1, γ2:1, γ3:1 are 1:1, 0.4167:1, 0.275:1. The resistor R4 of the input circuit 144 is 1 kΩ. The first output current signal Iout1 is 100A. The second output current signal Iout2 and the third output current signal Iout3 are 40 A and 20 A, respectively. The total output power of the power supply is 1446 W. Thereby, the voltage level of the node signal TP is 100A*1 mΩ*40+40 A*1 mΩ*0.4167*50+20 A*1 mΩ*0.275*50, which is 5.1084V. The corresponding current of the fully-output power ratio signal I_PSU % is 1 mA. The corresponding current of the power ratio signal I_PSU % is β*TP/R4, namely, 1 mA=β*5.1084 V/1 kΩ. It is deduced that 62 is 0.1957. If the first output current signal Iout1, the second output current signal Iout2, and the third output current signal Iout3 are 50 A, 20 A, and 10 A, respectively, the voltage level of the node signal TP is 4.5542V, and the power ratio signal I_PSU % is 0.16667*4.5542 V/1 k, which is equal to 0.89 mA and equivalent to 89% of the output power.

According to the above embodiments, the present application may be applied to single-voltage or multi-voltage output power signals for detecting the corresponding power ratio signal I_PSU %. The calibration circuit 142 performs calibration for normalizing the output power of a power supply to normalized power. For example, a power supply with the output power greater than 80% is a power supply with the so-called 80 PLUS certification, indicating good quality and avoiding performance deterioration. Besides,, the output power of a power supply may be detected automatically and the corresponding power ratio signal of the power supply may be adjusted automatically for the application of output power control of power supplies.

Accordingly, the present application conforms to the legal requirements owing to its novelty, nonobviousness, and utility. However, the foregoing description is only embodiments of the present application, not used to limit the scope and range of the present application. Those equivalent changes or modifications made according to the shape, structure, feature, or spirit described in the claims of the present application are included in the appended claims of the present application.

The invention claimed is:

1. A detection circuit for power load, comprising:
a sensing circuit, coupled to a power supply, including a plurality of impedance devices, detecting an output power signal of the power supply to obtain a load sensing signal, obtaining a sensing impedance according to the impedance devices and the load sensing signal, and generating a power sensing signal according to the sensing impedance and the output power signal load sensing signal; and
a signal generation circuit, coupled to the sensing circuit, including an input circuit, a second conversion circuit, and a calibration circuit, the input circuit coupled to the sensing circuit, the second conversion circuit coupled to the input circuit, the input circuit generating an input signal according to the power sensing signal, the second conversion circuit generating a power ratio signal according to the input signal, and the calibration circuit generating a calibrating signal according to the power ratio signal and feeding the calibrating signal to the second conversion circuit for driving the second conversion circuit further generating the power ratio signal according to the calibrating signal;
where the power sensing signal is corresponding to an output power of the power supply, and the output power of the power supply is controlled according to the power ratio signal.

2. The detection circuit for power load of claim 1, wherein the sensing circuit includes:
an amplification circuit, coupled to a load sensing device and including the impedance devices, the load sensing device sensing the output power signal and obtaining the load sensing signal, the amplification circuit obtaining the sensing impedance according to the load sensing signal and the impedance devices, and the amplification circuit amplifying the load sensing signal according to the sensing impedance, for generating a gain signal; and
a first conversion circuit, generating the power sensing signal based on the gain signal.

3. The detection circuit for power load of claim 2, wherein the sensing circuit further includes a summation circuit, coupled to the first conversion circuit and summing the power sensing signal.

4. The detection circuit for power load of claim 2, wherein the amplification circuit includes:
a first amplifier, coupled to the load sensing device, and amplifying the load sensing signal;
an impedance selection circuit, coupled to the first amplifier, including the impedance devices, obtaining the sensing impedance according to the load sensing signal and the impedance devices; and
a second amplifier, coupled to the impedance selection circuit, and generating the gain signal according to the sensing impedance and the load sensing signal.

5. The switch control module of claim 4, wherein said active switch comprises a snubber coupled to said second node; and said snubber guides a spike absorption current to flow through said biased switch when said second switch unit is turned off by said control unit.

6. The detection circuit for power load of claim 1, wherein the signal generation circuit further includes a trigger circuit coupled to the calibration circuit and generating a trigger signal to the calibration circuit according to a start signal.

7. The detection circuit for power load of claim 6, wherein the start signal corresponds to the output power signal, the power sensing signal, or the power ratio signal.

8. A method for detection of a detection circuit for power load, comprising steps of:
sensing an output power signal of a power supply by a sensing circuit to obtain a load sensing signal and obtaining a sensing impedance according to a plurality of impedance devices and the load sensing signal, and generating a power sensing signal according to the sensing impedance and the load sensing signal;
an input circuit of a signal generation circuit generating an input signal according to the power sensing signal;
a second conversion circuit of the signal generation circuit generating a power ratio signal according to the input signal; and
a calibration circuit generating a calibrating signal based on the power ratio signal for driving the second conversion circuit to perform a feedback control and generate the power ratio signal;
where the power sensing signal is corresponding to an output power of the power supply, and the output power of the power supply is controlled according to the power ratio signal.

9. The method for detection of a detection circuit for power load of claim 8, wherein the step of obtaining a sensing impedance by a sensing circuit sensing an output power signal of a power supply and according to the corresponding one of a plurality of impedance devices of the output power signal for generating a power sensing signal includes steps of:
a load sensing device sensing the output power signal to obtain the load sensing signal;
an amplification circuit selecting the sensing impedance according to the load sensing signal and the impedance devices and amplifying the load sensing signal according to an impedance value of the sensing impedance to generate a gain signal; and
a first conversion circuit generating the power sensing signal based on the gain signal.

10. The method for detection of a detection circuit for power load of claim 9, wherein the step of an amplification circuit selecting the sensing impedance according to the load sensing signal and the impedance devices and amplifying the load sensing signal according to the impedance value for generating a gain signal, further comprising steps of:
a first amplifier amplifying the load sensing signal;
an impedance selection circuit obtaining the sensing impedance according to the load sensing signal and the impedance devices; and
a second amplifier generating the gain signal based on the sensing impedance and the load sensing signal.

11. The method for detection of a detection circuit for power load of claim 9, where in the step of a first conversion circuit generating the power sensing signal based on the gain signal, the first conversion circuit generating the power sensing signal further based on a signal conversion ratio.

* * * * *